(12) United States Patent
Tanaka et al.

(10) Patent No.: US 6,815,733 B2
(45) Date of Patent: Nov. 9, 2004

(54) SWITCHING ELEMENT AND METHOD OF MAKING THE SAME

(75) Inventors: Haruo Tanaka, Kyoto (JP); Chihaya Adachi, Hokkaido (JP); Takahito Oyamada, Hokkaido (JP); Hiroyuki Sasabe, Hokkaido (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/392,278

(22) Filed: Mar. 19, 2003

(65) Prior Publication Data

US 2004/0108514 A1 Jun. 10, 2004

(30) Foreign Application Priority Data

Mar. 26, 2002 (JP) ...................................... 2002-086400

(51) Int. Cl.[7] .......................... H01L 29/74; H01L 31/111
(52) U.S. Cl. ...................................... 257/130; 257/155
(58) Field of Search ................................ 257/130, 155, 257/40

(56) References Cited

U.S. PATENT DOCUMENTS

| | | | |
|---|---|---|---|
| 4,652,894 A | * | 3/1987 | Potember et al. ............... 257/1 |
| 5,009,958 A | | 4/1991 | Yamashita et al. |
| 5,185,208 A | | 2/1993 | Yamashita et al. |
| 5,272,359 A | | 12/1993 | Nagasubramanian et al. |
| 2004/0012035 A1 | * | 1/2004 | Branz et al. ................ 257/130 |

FOREIGN PATENT DOCUMENTS

JP     63-283059    11/1988

OTHER PUBLICATIONS

R.S. Potember, et al., "A Current–Controlled Electrically Switched Memory State in Silver an Copper–TCNQF, Radical–Ion Salts", Synthetic Metals, 4 (1982), pp. 371–380.
R.S. Potember, et al., "Electrical Switching And Memory Phenomena In Cu–TCNQ Thin Films", Applied Physics Letter 34 (6), pp. 405–407, Mar. 1979.

* cited by examiner

Primary Examiner—Phat X. Cao
(74) Attorney, Agent, or Firm—Merchant & Gould P.C.

(57) ABSTRACT

The switching element has a switching layer between a first electrode layer and a second electrode layer. The switching layer includes a charge transfer complex containing an electron donor and an electron acceptor. An insulating layer is provided between the first electrode layer and the switching layer, and contacts the switching layer. The switching layer switches from a high-resistance state to a low-resistance state upon application of a voltage greater than a first threshold value in a first bias direction. Thereafter, the switching layer maintains the low-resistance state when the applied voltage decreases beyond the first threshold value. When the applied voltage becomes not smaller than a second threshold value in a second bias direction or a reverse direction to the first bias direction, the switching layer switches from the low-resistance state to the high-resistance state. Thereafter, the switching layer maintains the high-resistance state when the applied voltage decreases beyond the second threshold value.

20 Claims, 17 Drawing Sheets

FIG.6

| Cu:TCNQ | Cu Contents (mol%) | Cu Desposition Rates (Å/sec) | TCNQ Desposition Rates (Å/sec) |
|---|---|---|---|
| 0:1 | 0 | 0 | 2.5~3.0 |
| 1:2(0.5:1) | 33 | 0.3 | 1.9 |
| 1:1 | 50 | 0.5 | 1.6 |
| 3:2(1.5:1) | 60 | 0.7 | 1.5 |
| 2:1 | 67 | 1.0 | 1.6 |
| 4:1 | 80 | 1.5 | 1.2 |

FIG.12

|  | Element Structures |
|---|---|
| Emb. 1 | ITO(300nm) / Al(20nm) / Al₂O₃ / Cu-TCNQ(100nm, 1:1) / Al(100nm) |
| Emb. 2 | ITO(300nm) / Al(20nm) / Al₂O₃ / Cu-TCNQ(100nm, 1:2) / Al(100nm) |
| Emb. 3 | ITO(300nm) / Al(20nm) / Al₂O₃ / Cu-TCNQ(100nm, 3:2) / Al(100nm) |
| Ref. 1 | ITO(300nm) / Al(20nm) / Al₂O₃ / TCNQ(100nm) / Al(100nm) |
| Ref. 2 | ITO(300nm) / Al(20nm) / Al₂O₃ / Cu-TCNQ(100nm, 2:1) / Al(100nm) |
| Ref. 3 | ITO(300nm) / Al(20nm) / Al₂O₃ / Cu-TCNQ(100nm, 4:1) / Al(100nm) |
| Emb. 4 | ITO(300nm) / Al(20nm) / Al₂O₃ / Cu-TCNQ(50nm, 1:1) / Al(100nm) |
| Emb. 5 | ITO(300nm) / Al(20nm) / Al₂O₃ / Cu-TCNQ(200nm, 1:1) / Al(100nm) |
| Emb. 6 | ITO(300nm) / Al(20nm) / Al₂O₃ / Cu-TCNQ(300nm, 1:1) / Al(100nm) |
| Emb. 7 | ITO(300nm) / Al(20nm) / Al₂O₃ / Cu-TCNQ(100nm, 1:1) / Ag(100nm) |
| Emb. 8 | ITO(300nm) / Al(20nm) / Al₂O₃ / Cu-TCNQ(100nm, 1:1) / MgAg(100nm, 10:1) / Ag(10nm) |
| Emb. 9 | ITO(300nm) / Al₂O₃(5nm) / Cu-TCNQ(100nm, 1:1) / Al(100nm) |
| Emb. 10 | ITO(300nm) / Al₂O₃(7.5nm) / Cu-TCNQ(100nm, 1:1) / Al(100nm) |
| Emb. 11 | ITO(300nm) / SiO₂(5nm) / Cu-TCNQ(100nm, 1:1) / Al(100nm) |
| Emb. 12 | ITO(300nm) / SiO₂(10nm) / Cu-TCNQ(100nm, 1:1) / Al(100nm) |
| Ref. 4 | ITO(300nm) / Cu-TCNQ(100nm, 1:1) / Al(100nm) |
| Ref. 5 | ITO(300nm) / Cu(300nm) / Cu-TCNQ / Al(30nm) |

SWITCHING ELEMENT AND METHOD OF MAKING THE SAME

BACKGROUND OF THE INVENTION

1. Field of the Invention

The present invention relates to a switching element which operates in response to a change in applied voltage.

2. Description of Related Art

Electric conductivity in some materials changes drastically when an applied voltage changes. One of such materials is Cu-TCNQ, a copper complex of 7,7,8,8-tetracyanoquinonedimethane or TCNQ. Cu-TCNQ is a charge transfer complex including copper which serves as an electron donor and TCNQ which serves as an electron acceptor. When a voltage applied to the Cu-TCNQ is swept from a low-voltage side to a high-voltage side, the value of current increases drastically at a certain threshold voltage. Such a switching characteristic of the Cu-TCQN is disclosed in the article "*Electrical switching and memory phenomena in Cu-TCNQ thin films*" (R. S. Potember et al., *Applied Physics Letter* 34(6), pp. 405–407, Mar. 15, 1979).

The switching characteristic of Cu-TCNQ is expected to be utilized in a wide range of electronic devices. In recent years, with ongoing miniaturization of electronic devices, there is a concomitant trend of increasing density in components. In order for Cu-TCNQ to be used in such miniaturized electronic devices, film thickness of Cu-TCNQ must be decreased.

Conventionally, Cu-TCNQ for example is made in the form of a thin film by means of solution spreading method as disclosed in the article. In the solution spreading method, acetone and acetonitrile is mixed at a volume ratio of 1:1 for example, to prepare a solvent. This solvent is saturated with TCNQ, and a Cu substrate is soaked into the saturated solution. Then, charge transfer occurs from Cu to TCNQ on surfaces of the Cu substrate, resulting in formation of Cu-TCNQ. As the complex grows on the Cu substrate, a film of Cu-TCNQ is formed on the Cu substrate. This Cu-TCNQ is a polycrystalline film including a plurality of crystalline. Then, a thin film of Al is formed on the obtained Cu-TCNQ film. The result is a multilayer element including a Cu substrate, a Cu-TCNQ film and an Al film.

The above multilayer element is known to have a switching characteristic to be described below. Specifically, the Al film is used as an upper electrode, the Cu film is used as a lower electrode, and a voltage applied between the electrodes is swept. In this operation, at a certain threshold voltage, electric resistance of the Cu-TCNQ film which is in a high state changes to a low state. On the other hand, when the Cu-TCNQ film which is in the low resistance state is given a reverse bias voltage greater than a certain threshold value, the Cu-TCNQ film returns to the high-resistance state. As described in the article mentioned earlier, the following consideration has been made for this switching phenomenon: The high-resistance state appears when the Cu takes the state of cation radical and the TCNQ takes the state of anion radical, whereas the low-resistance state appears when the Cu takes the state of neutral atom and the TCNQ takes the state of neutral molecule. However, the switching mechanism is not yet known.

The Cu-TCNQ film made in the solution spreading method is a polycrystalline film formed of relatively large crystals, and therefore is low in film uniformity. This non-uniformity in the film causes various problems. For example, when this Cu-TCNQ film is incorporated in an element, the switching action is not reproduced. Specifically, a Cu-TCNQ film formed by means of the solution spreading method can take, as has been described above, a high-resistance state and a low-resistance state as an applied voltage changes, and then come back to the high-resistance state. However, when the voltage applied to the Cu-TCNQ film is swept thereafter, the switching does not take place. (The switching function is lost.) Another problem is that the Cu-TCNQ film is poor in stability. Because of these problems, no market has ever seen electronic devices incorporating a switching element provided by a conventional Cu-TCNQ film formed by means of the solution spreading method.

Another problem is that according to the solution spreading method it is difficult to control the thickness of the growing film. For example, when a Cu substrate is soaked into a TCNQ-saturated solvent to form a Cu-TCNQ film, control on the thickness of the Cu-TCNQ film is performed by taking the soaked Cu substrate out of the saturated solution in a certain predetermined amount of time. However, in such a method of control on the film thickness, it is difficult to obtain a desired thickness of the film. In addition, in the solution spreading method, the Cu-TCNQ film is formed as a polycrystalline film including relatively large crystals. For this reason, the control of the film thickness is possible only in the order of micron meters.

SUMMARY OF THE INVENTION

The present invention was made under the above circumstances, and it is therefore an object of the invention to eliminate or reduce the conventional problems. A switching element provided by the present invention has a reproducible switching characteristic, and can be as thin as appropriately applicable to electronic devices. Further, a method provided by the present invention is suitable for a manufacture of such a switching element.

A first aspect of the present invention provides a switching element. This switching element includes a first electrode layer, a second electrode layer, a switching layer and an insulating layer. The switching layer includes a charge transfer complex containing an electron donor and an electron acceptor and is provided between the first electrode layer and the second electrode layer. The insulating layer contacts the switching layer between the first electrode layer and the switching layer. The switching layer switches from a high-resistance state to a low-resistance state upon application of a voltage greater than a first threshold value in a first bias direction between the first electrode layer and the second electrode layer, maintaining the low-resistance state when the applied voltage decreases thereafter beyond the first threshold value, and likewise, switches from the low-resistance state to the high-resistance state upon application of a voltage greater than a second threshold value in a second bias direction or a reverse direction to the first bias direction, maintaining the high-resistance state when the applied voltage decreases thereafter beyond the second threshold value.

Preferably, the switching element further includes an additional insulating layer between the switching layer and the second electrode layer.

Preferably, the first bias direction is a direction of voltage drop from one of the first and the second electrode layers to the other.

Preferably, the electron acceptor is provided by an organic compound having a pi electron system.

Preferably, the electron acceptor is provided by TCNQ or a derivative of TCNQ.

Preferably, the electron donor is provided by a metal. The metal is selected from a group consisting of Cu, Ag and K.

Preferably, a presence ratio of the electron donor to the electron acceptor in the switching layer is not smaller than a half and not greater than three seconds.

Preferably, the switching layer contains an amorphous structure.

Preferably, the insulating layer contains an oxide. The oxide is provided by $Al_2O_3$ or $SiO_2$.

Preferably, the second electrode layer contacts the switching layer, and contains at least one of Al, Mg and Ag.

A second aspect of the present invention provides a method of making the switching element according to the first aspect. The method includes: a first-electrode layer forming step for formation of a first electrode layer on a substrate; an insulating layer forming step for formation of an insulating layer on the first electrode layer; a switching layer forming step for formation of a switching layer by depositing an electron donor material and an electron acceptor material on the insulating layer; and a second-electrode layer forming step for formation of a second electrode layer.

The method further includes a step of forming an additional insulating layer on the switching layer after the switching layer forming step.

Preferably, the first-electrode forming step uses a vacuum deposition method or a spattering method for deposition of a first electrode material on the substrate, and the deposited electrode material in the first-electrode forming step is exposed to the atmosphere in the insulating layer forming step.

Preferably, a surface of the first electrode layer formed in the first-electrode forming step is subjected to a UV ozone treatment in the insulating layer forming step.

Preferably, the switching layer forming step uses a vacuum deposition method for deposition of the electron donor material and the electron acceptor material on the insulating layer.

Preferably, a ratio of a deposition rate of the electron donor material to a deposition rate of the electron acceptor material in the switching layer forming step is not smaller than 1.5/0.7 and not greater than 1.9/0.3.

Preferably, the method further includes a curing step of leaving the element under vacuum after the second-electrode layer forming step.

Preferably, the method further includes an aging step for application of a voltage between the first electrode layer and the second electrode layer.

Other characteristics and advantages of the present invention will become clearer from the description of preferred embodiments to be made here below.

BRIEF DESCRIPTION OF THE DRAWINGS

FIG. 6 is a table showing presence ratios between Cu and TCNQ, as well as Cu contents, Cu deposition rates and TCNQ deposition rates in Cu-TCNQ thin films.

FIG. 12 lists element structures in Embodiments 1 through 12 and References 1 through 5.

DETAILED DESCRIPTION OF PREFERRED EMBODIMENT

Hereinafter, preferred embodiments of the present invention will be described in detail, with reference to the attached drawings.

Figure 1:
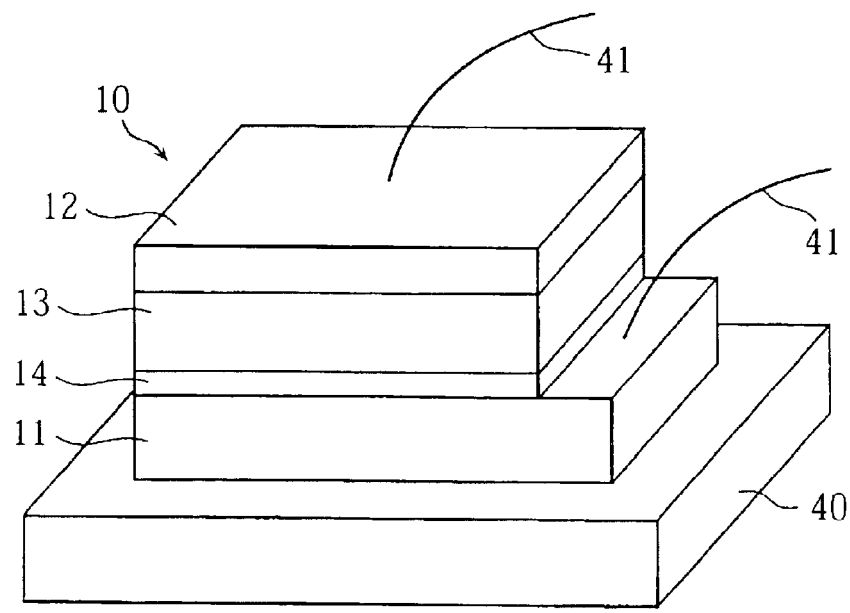
FIG. 1 is a conceptual diagram of a switching element according to a first mode of embodiment of the present invention.

FIG. 1 is a conceptual diagram of a switching element 10 according to a first mode of embodiment of the present invention. The switching element 10 is placed on a substrate 40, and has a laminate structure including a first electrode layer 11, a second electrode layer 12, a switching layer 13 and an insulating layer 14.

The first electrode layer 11 is formed of a metal such as Cu and Al or an oxide semiconductor such as ITO (Indium Tin Oxide), and has a thickness of 1 through 1000 nm. The second electrode layer 12 is formed of e.g. Al, Mg, Ag, and a Mg-Ag alloy, and has a thickness of 1 through 1000 nm. The switching layer 13 contains a charge transfer complex, i.e. a material including an electron donor and an electron acceptor, and has a thickness of e.g. 1 through 1000 nm. Examples of the charge transfer complex include materials having the pi electron system such as TCNQ, as well as Cu complex, Ag complex and K complex of TCNQ. The insulating layer 14 is formed of an insulator such as $Al_2O_3$, $SiO_2$ and SiO, and has a thickness of 0.1 through 100 nm. The substrate 40 is made of glass or quarts for example. Each of the first electrode layer 11 and the second electrode layer 12 is connected to a wire 41. Trough these wires 41, a predetermined bias voltage is applied between the first electrode layer 11 and the second electrode layer 12.

Figure 2:
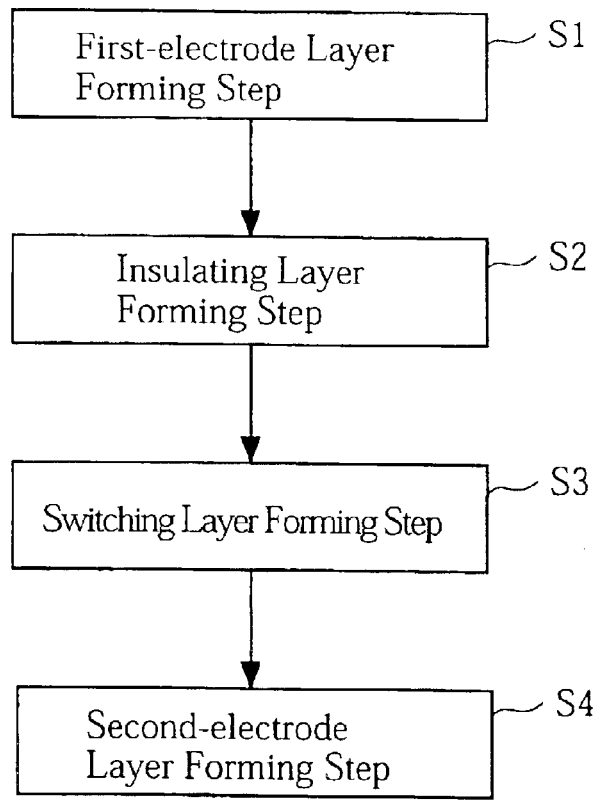
FIG. 2 is a flowchart showing a method of manufacturing the switching element in FIG. 1.

FIG. 2 is a flowchart showing a method of manufacturing the switching element 10. The method includes four steps S1 through S4.

Step S1 is a first-electrode layer forming step, in which the first electrode layer 11 is formed on the substrate 40. Specifically, by means of vapor deposition (such as electron beam deposition and resistance heating deposition) or spattering, a film of a material selected from those described above for the first electrode layer is formed on the substrate 40. In this step, in order to make a desired shape, a mask is used as should be already common among those skilled in the art. Though masks are also used in the following steps as necessary, the use of masks will not be mentioned unless especially essential.

Step S2 is an insulating layer forming step, in which the insulating layer 14 is formed on the first electrode layer 11. Specifically, a film of insulating material such as $Al_2O_3$, $SiO_2$ and SiO is formed on the first electrode layer 11 by means of vapor deposition, spattering and soon. Alternatively to those methods, the insulating layer 14 may be formed by oxidation of the surface of the first electrode layer 11. A method of the oxidation can be UV ozone treatment on the surface of the first electrode layer 11 using a V ozone cleaner. The V ozone treatment herein means a use of oxygen radical or ozone generated by ultraviolet rays for oxidization of a surface of a member. Alternatively, the first electrode layer 11 may be exposed to the atmosphere so that the surface of the first electrode layer 11 is oxidized.

Step S3 is a switching layer forming step, in which the switching layer 13 is formed on the insulating layer 14. Specifically, by means of vapor deposition or spattering for example, an electron donor material and an electron acceptor material are deposited on the insulating layer 14. The electron donor material can be Cu, Ag or K. The electron acceptor material can be TCNQ or a derivative therefrom.

Step S4 is a second-electrode layer forming step, in which the second electrode layer 12 is formed on the switching layer 13. Specifically, by means of vapor deposition, spattering and so on, a film of a material selected from those described above for the second electrode layer is formed on the switching layer 13. When the second electrode layer 12 is formed by means of vapor deposition or spattering, it is preferable that the switching element 10 is left under the vacuum in the chamber for not shorter than 10 minutes before being taken out of the apparatus. By taking such a curing step, it becomes possible to reduce unwanted oxidization of a fresh surface of the switching element 10.

Figure 3A:
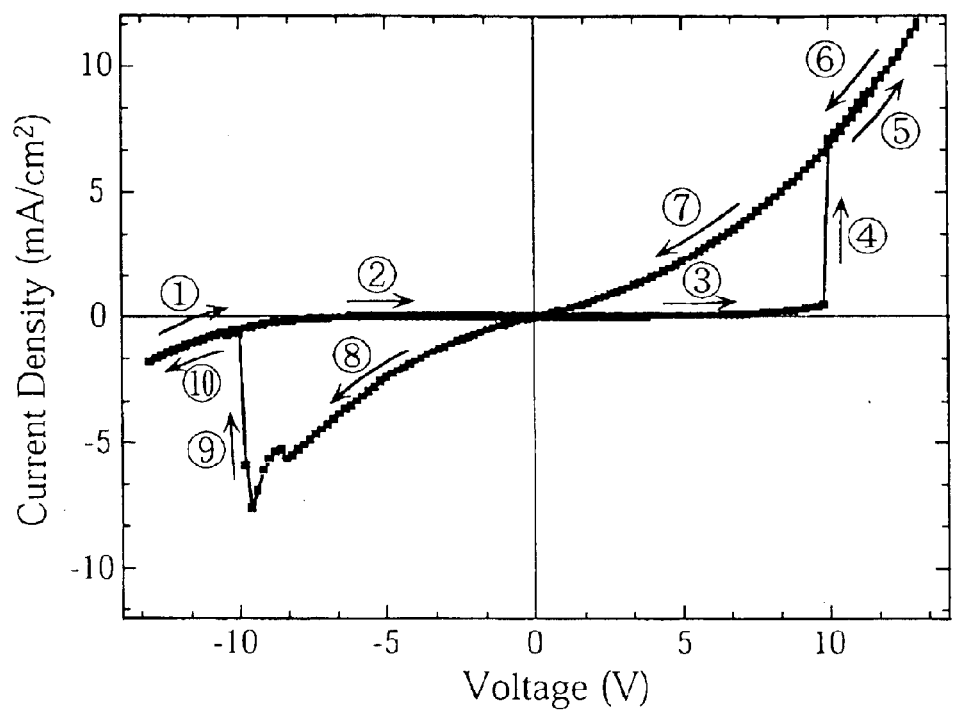
FIG. 3 is a J-V characteristic curve showing a conceptual switching characteristic of a switching element according to the present invention.
Figure 3B:
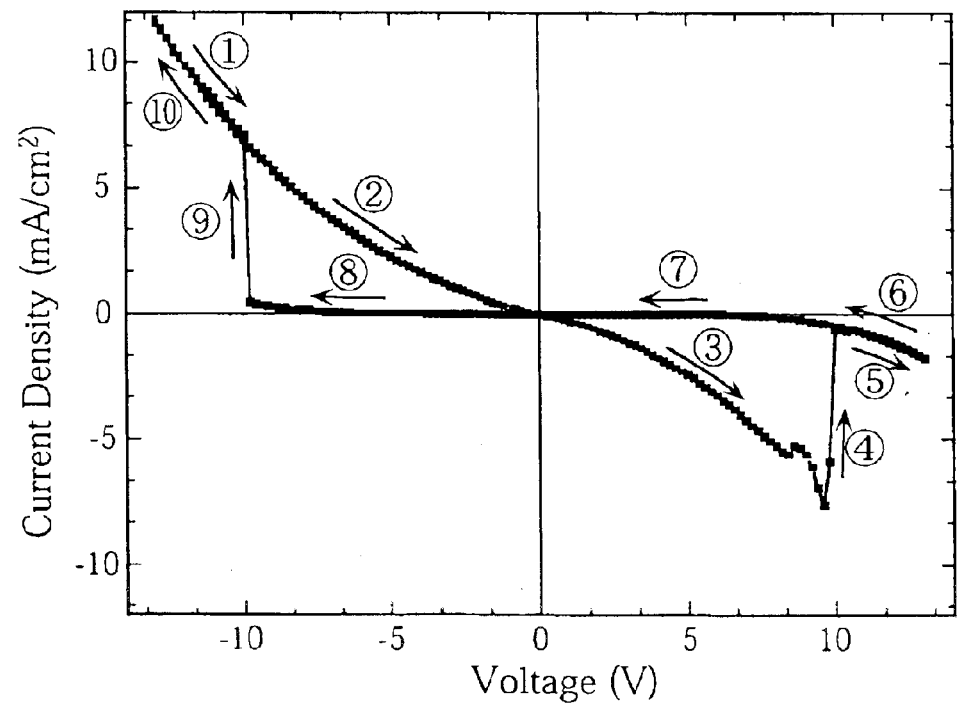

When a switching element 10 manufactured as the above is subjected to a voltage sweep, electric conductivity changes drastically at a certain voltage (threshold voltage). FIG. 3A and FIG. 3B are J-V characteristic curves showing a switching characteristic of a switching element according to the present invention. FIG. 3A shows a hysteresis curve of a case in which the applied voltage was swept from reverse bias to normal bias (from Arrow 1 to Arrow 5), resulting in drastic decrease (Arrow 4) in electric conductivity at a first threshold voltage in the normal bias, whereas the applied voltage was swept from normal bias to reverse bias (from Arrow 6 to Arrow 10), resulting in drastic increase (Arrow 9) in electric conductivity at a second threshold voltage in reverse bias. On the other hand, in a case shown in FIG. 3B, the applied voltage was swept from reverse bias to normal bias (from Arrow 1 to Arrow 5), resulting in drastic increase (Arrow 4) in electric conductivity at a first threshold voltage in normal bias, whereas the applied voltage was swept from normal bias to reverse bias (from Arrow 5 to Arrow 10), resulting in drastic decrease (Arrow 9) in the electric conductivity at a second threshold voltage in reverse bias. The normal bias used herein means a state of the switching element 10 in which the first electrode layer 11 has a higher electric potential than the second electrode layer 12, whereas the reverse bias means vise versa.

According to the switching element 10, the switching characteristic represented by FIG. 3A or FIG. 3B is reproduced every time the applied voltage is swept. When materials for the switching layer 13 and the insulating layer 14 which makes surface contact to the switching layer are appropriately selected, the switching characteristic shown in FIG. 3A or FIG. 3B is obtained. The switching element 10 as described above has a good reproducibility in on-off control based on the two states, i.e. the high-resistance state and the low-resistance state, and therefore is applicable to a variety of electronic devices. For example, the element can be used as a switching element in an organic EL display, liquid crystal display and so on.

Figure 4:
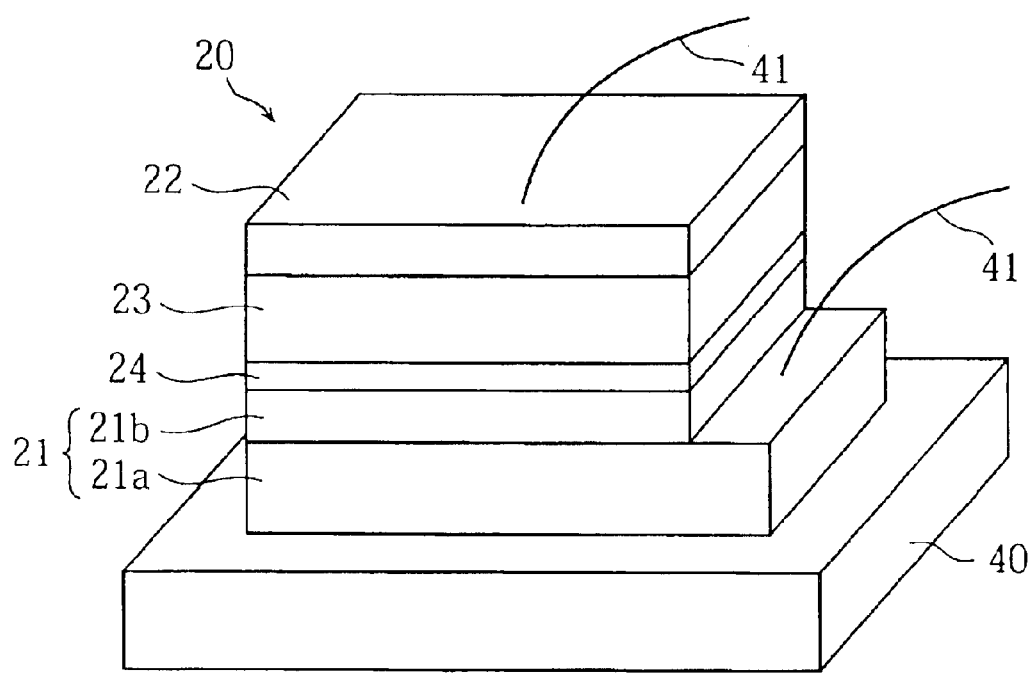
FIG. 4 is a conceptual diagram of a switching element according to a second mode of embodiment of the present invention.

FIG. 4 is a conceptual diagram of a switching element 20 according to a second mode of embodiment of the present invention. The switching element 20 has a laminate structure including a first electrode layer 21, a second electrode layer 22, a switching layer 23 and an insulating layer 24. This laminate structure is placed on a substrate 40. The first electrode layer 21 has a two-layer structure including a lower layer 21a and an upper layer 21b.

The first electrode layer 21 which has a two-layer structure allows more versatile design than the first electrode layer 11 according to the first mode of embodiment. For example, it is possible to use a material having a high electric conductivity for formation of the lower layer 21b to be much thicker than the upper layer 21a and to serve as a main part of the first electrode layer 21, whereas the thin upper layer 21b can be formed of a material suitable for formation of the insulating layer 24, namely a material which can be oxidized to form an appropriate insulating layer 24. The lower layer 21a is formed of Cu or ITO for example, and has a thickness of 1 through 1000 nm. The upper layer 21b is formed of Al for example, and has a thickness of 1 through 1000 nm. The second electrode layer 22, the switching layer 23 and the insulating layer 24 are formed of the same materials and have the same thicknesses as has been described with respect to the switching element 10 according to the first mode of embodiment.

Figure 5:
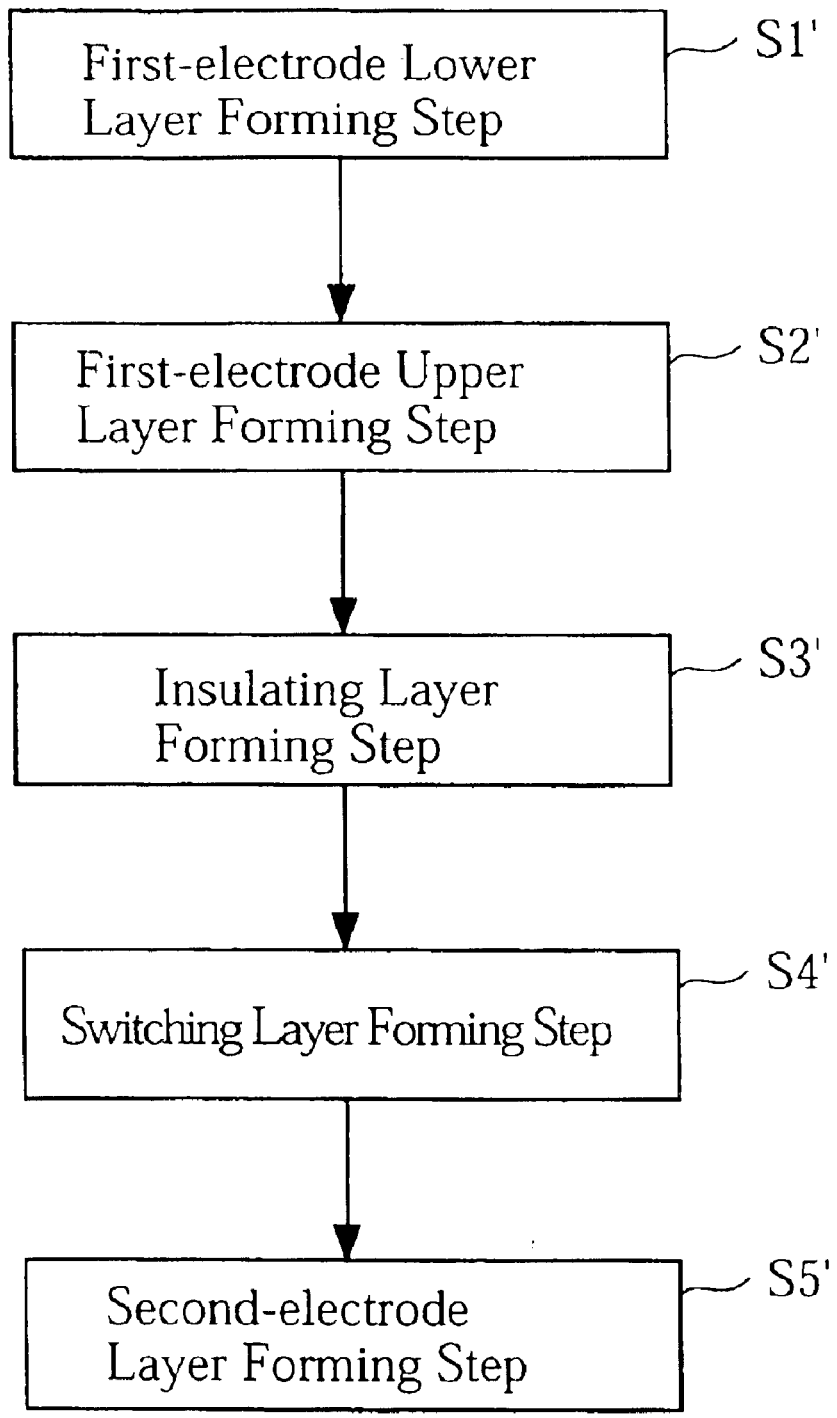
FIG. 5 is a flowchart showing a method of manufacturing the switching element in FIG. 4.

FIG. 5 is a flowchart showing a method of manufacturing the switching element 20. Manufacture of the switching element 20 is made in the following sequence. First, Step S1' is a step for forming the lower layer of the first electrode, in which a lower layer 21a is formed on a substrate 40. Specifically, by means of vapor deposition (such as electron beam deposition and resistance heating deposition), spattering and so on, a film of a material selected from those described above for the lower layer is formed on the substrate 40.

Next, Step S2' is for forming the upper layer of the first electrode, in which an upper layer 21b is formed on the lower layer 21a. Specifically, a film of Al for example is formed on the lower layer 21b by means of vapor deposition, spattering or the like.

Next, Step S3' is for forming the insulating layer, in which the insulating layer 24 is formed by oxidizing an upper surface of the upper layer 21b. The oxidization can be performed by using any of the methods described with respect to the first mode of embodiment.

Next, in the same way as the first mode of embodiment, Step S4' is performed for formation of the switching layer, in which a switching layer 23 is formed on the insulating layer 24. Then, Step S5' is performed for formation of the second electrode layer, in which a second electrode layer 22 is formed on the switching layer 23.

According to the first and the second modes of embodiment, as shown in FIG. 1 and FIG. 4, the second electrode layers 12, 22 are laminated directly onto the respective switching layers 12, 23. Alternatively, according to the present invention, an insulating layer may be formed between the switching layers 13, 23 and the respective second electrode layers 12, 22. When such a structure is employed, the insulating layer is formed on the switching layers 13, 23 by means of vapor deposition, spattering or the like, using an insulating material. In addition to the insulating layers 14, 24 between the first electrode layers 11, 21 and the respective switching layers 13, 23, a similar insulating layer may be formed between the second electrode layers 12, 22 and the respective switching layers 13, 23. This makes possible to change the switching characteristic from a type shown in FIG. 3A to a type shown in FIG. 3B.

Next, embodiments of the present invention will be described in comparison to references. First, the description will cover film structure analysis of the charge transfer complex films used in the embodiments and the references.

<Method of Making Samples for the Film Structure Analysis>

The switching layer in the switching element according to the present invention is provided by a thin film of a charge transfer complex. Thin film samples for the film structure analysis of this charge transfer complex thin film were made according to the following steps: First, a clean substrate is mounted to a copper substrate specifically made for a vapor depositing apparatus (Vapor Depositing Apparatus E100 for Organic EL Research and Development; manufactured by Advanced Lab Systems Co., Ltd), and then set to a substrate holder in the chamber of the apparatus. Electrodes in the chamber are connected to a tungsten boat loaded with two 5-mm Cu wires (manufactured by Nilaco Corporation) and to a stainless steel boat loaded with about 1 gram of TCNQ (manufactured by Tokyo Kasei Kogyo Co., Ltd). Next, pressure inside the chamber is reduced, and after the vacuum level in the chamber has decreased to not greater than $3 \times 10^{-3}$ Pa, Cu and TCNQ are vaporized and co-deposited on the substrate. The thickness of the film is controlled by controlling the depositing time. After the deposition, the substrate is left under the vacuum for 10 minutes. Thereafter, the pressure in the chamber is returned to the normal atmospheric pressure, and the substrate is taken out.

The above method was used in the formation of Cu-TCNQ thin films on substrates selected for measurements to be described below. Five kinds of deposition ratio between Cu and TCNQ were used, namely, 1:2, 1:1, 3:2, 2:1 and 4:1. In addition to these, a sample in which only a film of TCNQ is formed on the substrate was prepared. FIG. 6 shows specifics of these thin film samples, i.e. presence ratios of Cu and TCNQ, corresponding Cu contents (mol %), Cu depositing rates and TCNQ depositing rates for making the samples.

<UV/VIS Measurements>

Figure 7:
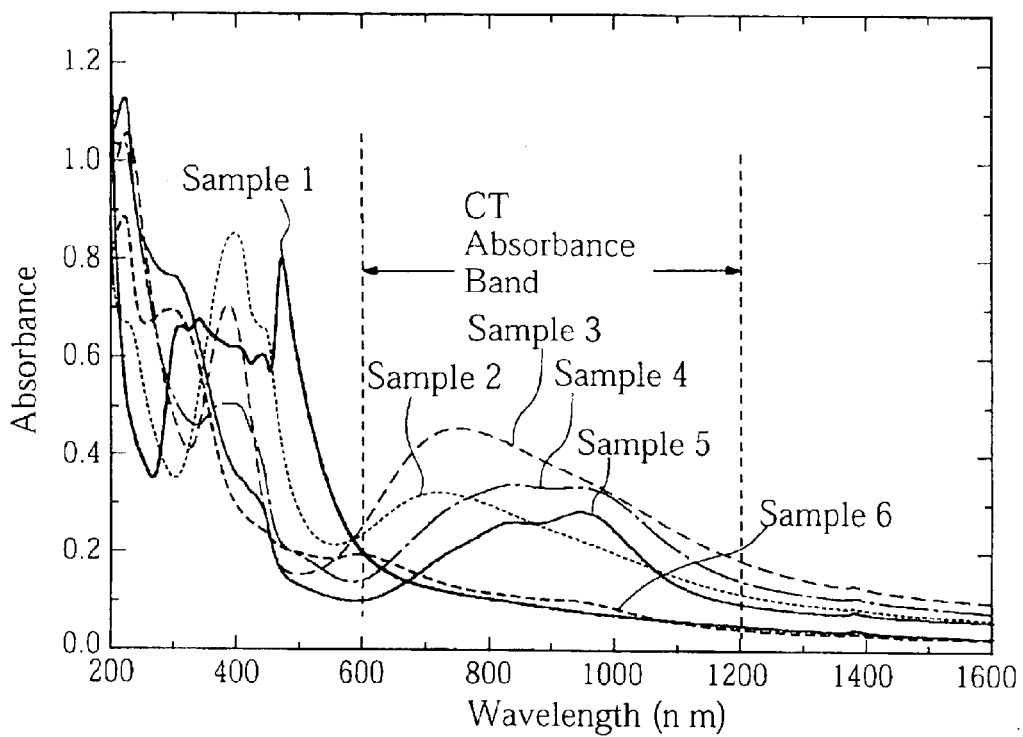
FIG. 7 shows absorption spectra in an ultraviolet-visible range in Samples 1 through 6.

Samples 1 through 6 were prepared for the measurements. Each sample included a deposit (thickness: 50 mm) of Cu and TCNQ at a predetermined deposition ratio on a quarts substrate (20×20×1 mm; manufactured by Matsunami Glass Ind., Ltd.) The Cu-TCNQ deposition ratio for each sample was 0:1 for Sample 1, 1:2 for Sample 2, 1:1 for Sample 3, 3:2 for Sample 4, 2:1 for Sample 5 and 4:1 for Sample 6. Each sample was measured for UV-visible range absorbance spectra, using a spectrophotometer (UV-3100, manufactured by Shimadzu Corporation). FIG. 7 shows results of the measurements.

As shown in FIG. 7, in Samples 2 through 5, absorption was observed in a 600–1200 nm range. This absorption is due to charge transfer (CT) from Cu to TCNQ. On the other hand, no such absorption was observed in Samples 1 and 6. From these results, it is understood that thin film formation of Cu-TCNQ charge transfer complex is possible by controlling the deposition ratio of Cu and TCNQ.

<UV/VIS Angle Dependency>

Figure 8:
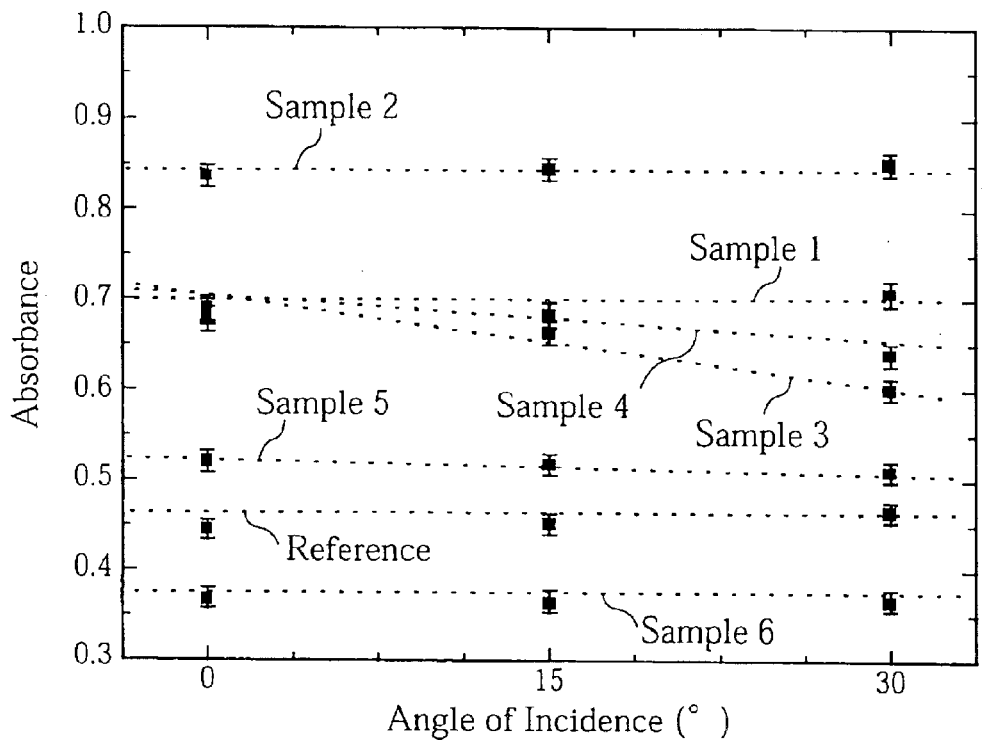
FIG. 8 shows angle dependency of absorbance in Samples 1 through 6.

Each of the above samples was measured for angle dependency of the UV-visible range absorbance, using a spectrophotometer (UV-3100, manufactured by Shimadzu Corporation). Specifically, a sample holder was manufactured so that a surface of each thin film sample can be held at 0-dgree, 15-degree or 30-degree angles of incidence with respect to the optical axis of the spectrophotometer. The angle dependency of the UV-visible range absorbance was measured using this holder. The measurements were made not only to Samples 1 through 6 but also to a reference, a thin film of amorphous TPD formed on the quartz substrate. FIG. 8 shows results of the measurements.

As shown in FIG. 8, in Samples 3 through 5, decrease in absorbance was observed as the angle of incidence increased. In Samples 1, 2 and 6 and the reference, the absorbance was constant regardless of the change in the angle of incidence. From these results, it is considered that most of the TCNQ in the thin film is parallel to the substrate when the presence ratio between Cu and TCN is 1:1 (Sample 3), 3:2 (Sample 4) or 2:1 (Sample 5).

<FT-IR Measurements>

Figure 9:
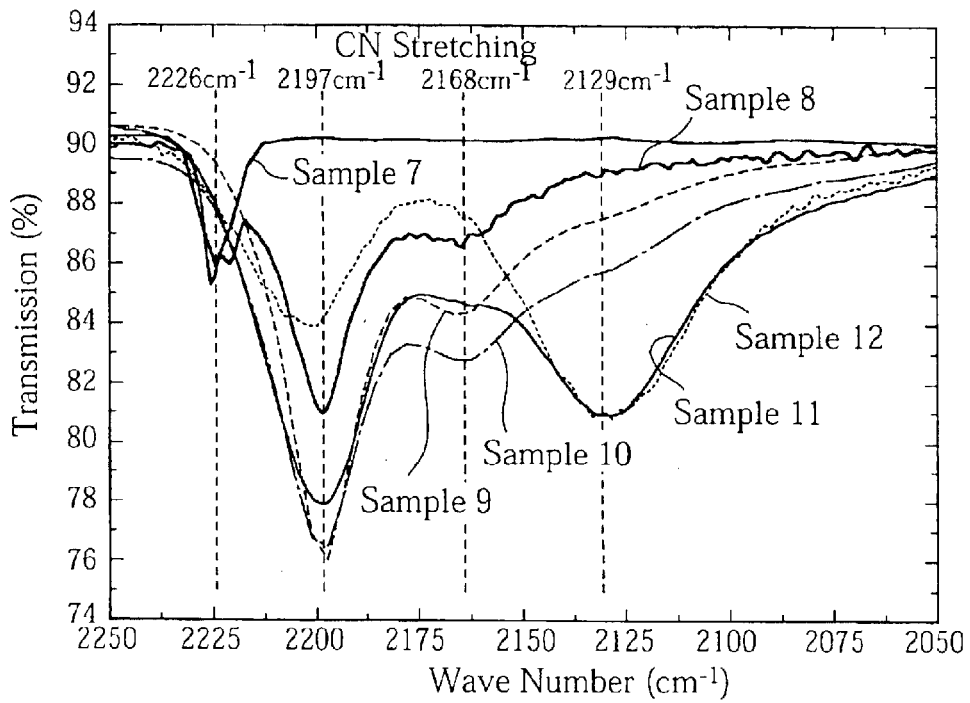
FIG. 9 shows infrared absorption spectra in Samples 7 through 12.
Figure 10:
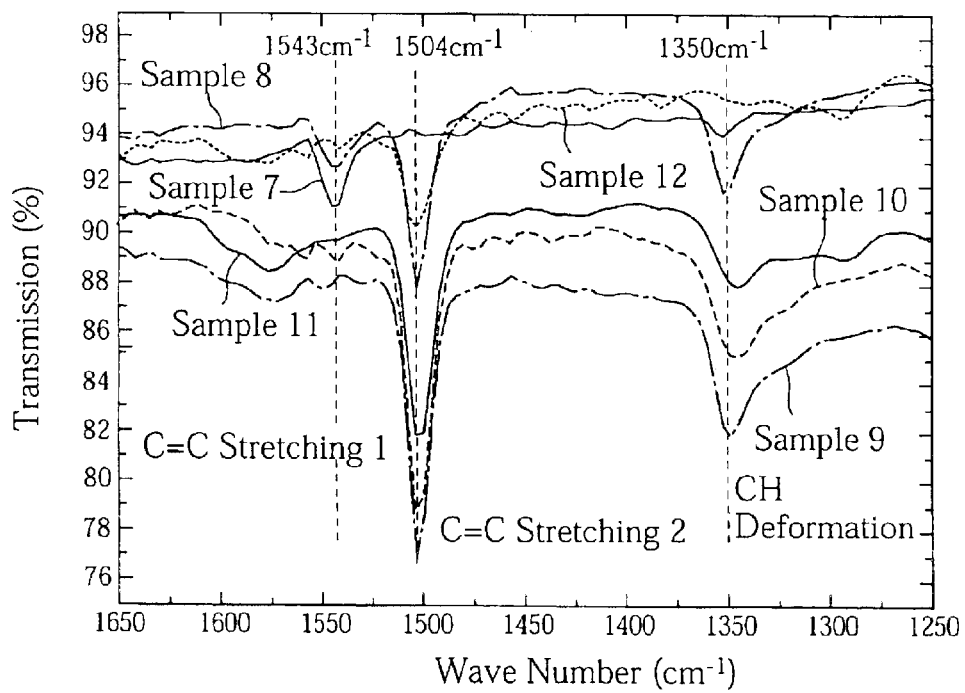
FIG. 10 shows infrared absorption spectra in another range of wave number in Samples 7 through 12.
Figure 11:
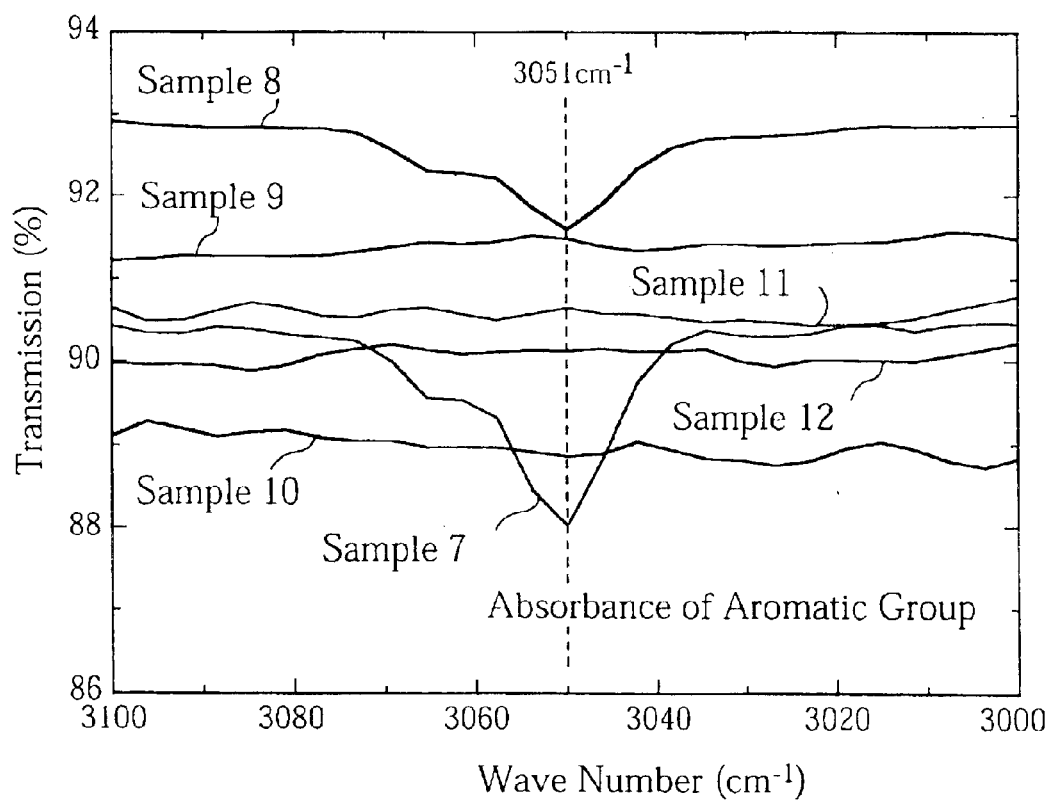
FIG. 11 shows infrared absorption spectra in still another range of wave number in Samples 7 through 12.

Samples 7 through 12 were prepared for the measurements. Each sample included a deposit (thickness: 50 mm) of Cu and TCNQ at a predetermined deposition ratio on a NaCl substrate (30×30×5 mm; manufactured by JASCO Corporation). The Cu-TCNQ deposition ratio for each sample was 0:1 for Sample 7, 1:2 for Sample 8, 1:1 for Sample 9, 3:2 for Sample 10, 2:1 for Sample 11 and 4:1 for Sample 12. Each sample was measured for infrared absorbance spectra, using a Fourier Transform Infrared Spectrometer (FTIR-8700, manufactured by Shimadzu Corporation). FIG. 9 through FIG. 11 show results of the measurements.

As shown in FIG. 9, absorption observed at 2226 $cm^{-1}$ in Sample 7 (a thin film made only of TCNQ) shifted toward a lower frequency side of 2197 $cm^{-1}$ and 2168 $cm^{-1}$ in Samples 8 through 10 which had smaller Cu content. A shift was also observed toward the lower frequency side of 2197 $cm^{-1}$ and 2129 $cm^{-1}$ in Samples 11 and 12 which had larger Cu content. The shift occurred to a different degree in some, presumably due to increased interaction between Cu and TCNQ along with Cu content in the thin film, which resulted in an increase in the amount of charge transfer from Cu to TCNQ. Such an interaction with Cu also influences, as observed in FIG. 10 and FIG. 11, stretching vibration of C=C, deformation vibration of CH, and vibration of aromatic rings, causing warp in the molecular structure of TCNQ.

<Polarizing Characteristic>

Samples 13 through 18 were prepared for the polarizing characteristic measurements. Each sample included a deposit (thickness: 50 nm) of Cu and TCNQ at a predetermined deposition ratio on a glass substrate (20×20×1 mm; manufactured by Matsunami Glass Ind., Ltd.) The Cu-TCNQ deposition ratio for each sample was 0:1 for Sample 13, 1:2 for Sample 14, 1:1 for Sample 15, 3:2 for Sample 16, 2:1 for Sample 17 and 4:1 for Sample 18. Each sample was measured for polarizing characteristic with respect to a plane parallel to the substrate, using a polarizing microscope (E400, manufactured by Nicon Corporation). Results showed no polarization with respect to a plane parallel to the substrate in any of Samples 13 through 18. This indicates that regardless of the Cu content, TCNQ has a mutually random orientation in the plane parallel to the substrate.

<Surface Analysis Using SEM>

Samples 19 through 24 were prepared for this analysis. Each sample included a deposit (thickness: 100 nm) of Cu and TCNQ at a predetermined deposition ratio on a substrate. The substrate was a glass plate (10×10×1 mm; manufactured by Matsunami Glass Ind., Ltd,) on which an ITO layer was formed to a thickness of 300 nm by means of vapor deposition. On this ITO layer, an Al layer was formed to a thickness of 20 nm by means of vapor deposition. Each sample was made by forming a thin film of Cu-TCNQ or a thin film of TCNQ on the Al layer of the substrate. The Cu-TCNQ deposition ratio for each sample was 0:1 for Sample 19, 1:2 for Sample 20, 1:1 for Sample 21, 3:2 for Sample 22, 2:1 for Sample 23 and 4:1 for Sample 24. For each sample, observation was made to the surface of the thin film and the surface of the Al layer before the formation of the thin film, using a scanning electron microscope (S-3500, manufactured by Hitachi Ltd.) The surface observation of the thin film was performed to the order of 5 $\mu$m under the vacuum, with acceleration voltage of 25 kV.

As a result, Sample 19 was found to have structures including fine crystals of about 50 nm. Sample 20 was found to have structures including fine crystals of about 2 $\mu$m. Sample 21 was found to have fine crystals of about 2 $\mu$m scattered on an amorphous surface. Samples 22 through 24 were found to have amorphous structures. The observation of the Al layer surface before the thin film formation found amorphous structures on the surface.

<Surface Analysis Using AFM>

The thin film surface and the Al layer surface of Samples 19 through 24 were also observed by using an atomic force microscope (JSTM-4200, manufactured by JEOL). The surface observation of the thin film was performed to the order of 500 nm.

As a result, Sample 19 was found to have structures made of fine crystals of about 50 nm. Sample 20 was found to have structures made of fine crystalline as large as about 150 nm including fine crystals of about 50 nm. Sample 21 was found to have fine crystals of about 50 nm scattered on an amorphous surface made of fine crystals of about 20 nm. Samples 22 through 24 were found to have amorphous structures. The observation of the Al layer surface before the thin film formation found amorphous structures on the surface.

<Evaluation on Film Structures>

As described, the UV/VIS measurements revealed that thin film formation of Cu-TCNQ charge transfer complex is possible by controlling the deposition ratio of Cu and TCNQ. The UV/VIS angle dependency measurements led to a consideration that most of the TCNQ in the thin film is parallel to the substrate when the presence ratio between Cu and TCN is 1:1, 3:2 or 2:1. The FT-IR measurements revealed that the structure of TCNQ is deformed by interaction with Cu, and the extent of deformation is dependent upon the Cu content. The polarizing characteristic measurements revealed that TCNQ has a mutually random orientation in the plane parallel to the substrate regardless of the Cu content. The SEM observation and the AFM observation revealed that the thin film includes an amorphous structures when Cu content is 50% or over.

[Embodiment 1]

<Making a Switching Element>

A glass substrate (10×10×1 mm; manufactured by Matsunami Glass Ind., Ltd,) on which an ITO layer (300 nm thickness) was formed in advance, was mounted to a copper substrate specifically made for a vapor depositing apparatus (Vapor Depositing Apparatus E100 for Organic EL Research and Development; manufactured by Advanced Lab Systems Co., Ltd), and then set to a substrate holder in the chamber of the apparatus. A tungsten spiral boat loaded with approximately 1 gram of Al (manufactured by Nilaco Corporation) was connected to the electrode in the chamber. Next, pressure inside the chamber was reduced, and under the vacuum range between 3 to $4 \times 10^{-3}$ Pa, Al was vaporized and deposited on the substrate. The depositing rate was 1 to 1.5 Å/sec and the deposition was continued to a thickness of 20 nm. Thereafter, the pressure in the chamber was returned to the normal atmospheric pressure, and using a UV ozone cleaner (manufactured by Nippon Laser & Electronics Lab), the surface of the Al on the ITO/Al substrate was oxidized. In this oxidizing process, one minute was allocated for the oxidization, 12.5 minutes was used for the UV treatment, and one minute was spent for nitrogen treatment, whereby the surface of the Al film was formed with an insulating thin film of $Al_2O_3$ to a thickness of approximately 0.5 to 10 nm.

Next, the substrate formed with the ITO/Al/$Al_2O_3$ were set in the chamber of the apparatus. Electrodes in the chamber were connected to a tungsten boat loaded with two 5 mm Cu wires (manufactured by Nilaco Corporation) and to a stainless steel boat loaded with approximately 1 gram of TCNQ (manufactured by Tokyo Kasei Kogyo Co., Ltd). Then, pressure inside the chamber was reduced, and after the vacuum level in the chamber decreased to not greater than $3 \times 10^{-3}$ Pa, Cu and TCNQ were vaporized and co-deposited on the $Al_2O_3$ film on the substrate. Deposition ratio between Cu and TCNQ was 1:1, and the Cu-TCNQ was allowed to grow to a thickness of 100 nm. After the deposition, the substrate was left under the vacuum for 10 minutes. Thereafter, the pressure in the chamber was returned to the normal atmospheric pressure, and the substrate was taken out.

Next, a mask having a 1-mm opening was placed onto the Cu-TCNQ thin film. The substrate was then set to the substrate holder in the chamber of the vapor depositing apparatus. A tungsten spiral boat loaded with approximately 1 gram of Al (manufactured by Nilaco Corporation) was connected to an electrode in the chamber. Next, pressure inside the chamber was reduced, and under the vacuum range between 3 to $4 \times 10^{-3}$ Pa, Al was vaporized and deposited on the substrate. The depositing rate was 1 to 1.5 Å/sec and the deposition was continued to a thickness of 100 nm. After the deposition, the substrate was left under the vacuum for 10 minutes. Thereafter, the pressure in the chamber was returned to the normal atmospheric pressure, and the substrate was taken out. In this way, a switching element was made which included a glass substrate formed with a laminate structure of ITO (300 nm)/Al (20 nm)/$Al_2O_3$ (0.5–10 nm)/Cu-TCQ(100 nm)/Al (100 nm). According to the present embodiment, the ITO layer (300 nm) represents the lower layer of the first electrode layer, the next Al layer (20 nm) represents the upper layer of the first electrode layer, the $Al_2O_3$ layer (0.5–10 nm) represents the insulating layer, the Cu-TCNQ layer (100 nm) represents the switching layer, and the Al layer (100 nm) represents the second electrode layer. The element structure of the present embodiment is shown in FIG. 12.

<J-V Measurement>

Figure 13:
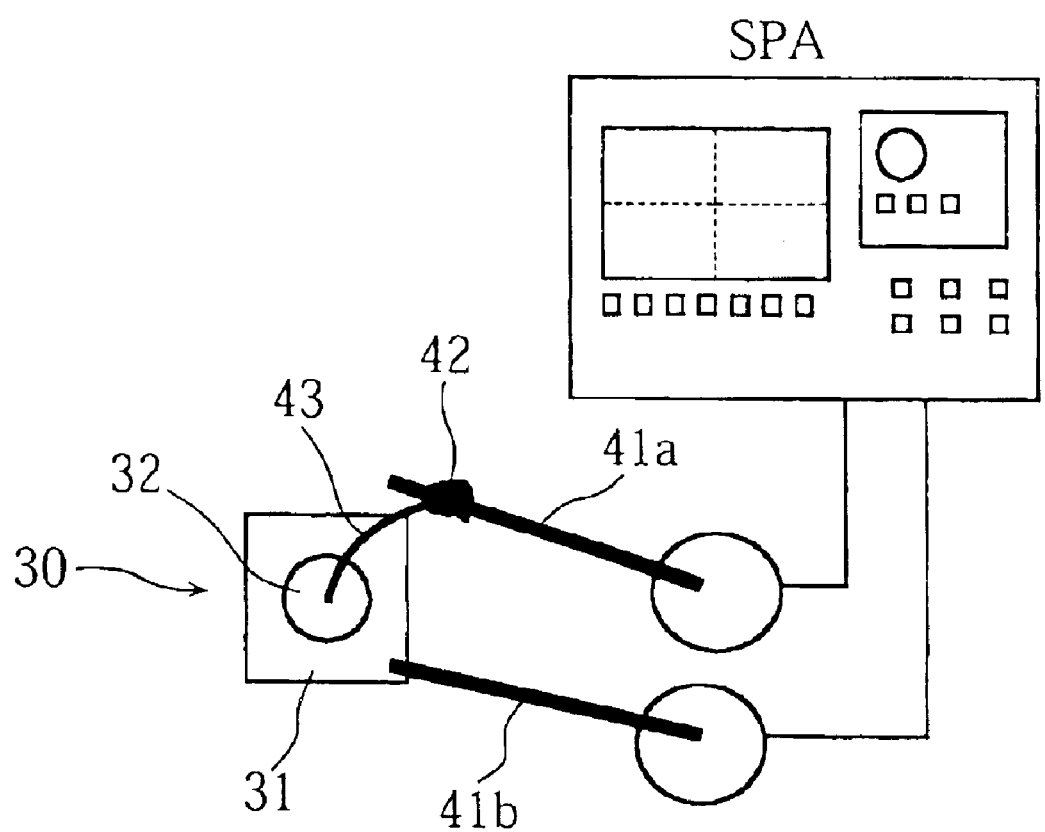
FIG. 13 shows an outline of a system for J-V measurement.

The switching element made as the above was subjected to a current-voltage (J-V) measurement using an SPA (Semiconductor Parameter Analyzer HP4155C, manufactured by Agilent Technologies). FIG. 13 also shows a schematic diagram of the measuring system. FIG. 13 shows a conceptual plan-view shape of the switching element 30. As shown in FIG. 13, a probe electrode 41a (micro probe, manufactured by Allesi) was connected to a 0.1-mm gold wire 43 (manufactured by Nilaco Corporation) with silver paste 42. The gold wire 43 was contacted to the second electrode layer 32 (the Al layer in the present embodiment) which had a 1-mm diameter. Another probe electrode 41b was contacted to the first electrode layer 31 (the ITO layer in the present embodiment).

Before performing the measurement, an aging process was performed to the switching element. The aging process includes holding a voltage between the first electrode and the second electrode of the switching element and sweeping of the voltage within a predetermined voltage range ("voltage sweep range") In this application, eight voltage sweep ranges were set: The first voltage sweep range was −1 to +1 [V], and the second voltage sweep range was −2 to +2 [V]. Likewise, the voltage sweep range was expanded gradually by 2 V, and the last or the eighth voltage sweep range had a voltage sweep range of (−8 to +8) V. The voltage sweeping of the voltage applied to the switching element was made in each of these eight voltage sweep ranges.

Specifically, first, within the first voltage sweep range (−1 to +1), the voltage applied to the switching element was swept. The voltage sweeping included two steps: In the first step, the voltage sweep was made from the reverse bias voltage to the normal bias voltage. The second step was followed, in which the voltage sweep was made from the normal bias voltage to the reverse bias voltage. These first and the second steps were alternated until the element showed stability in its electrical characteristics.

Such a voltage sweeping cycle was also made in each of the second through the eighth voltage sweep ranges. As a result of the aging process, the switching element was found not being destroyed by a voltage of 10 volts or larger.

Figure 14:
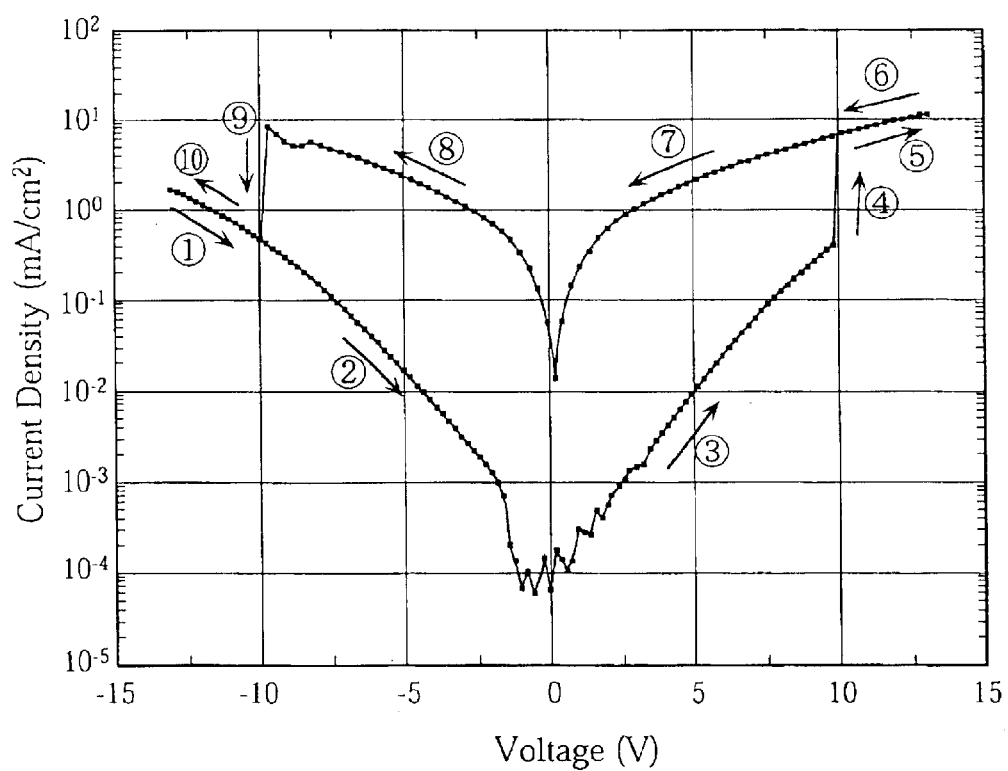
FIG. 14 shows a J-V characteristic curve in Embodiment 1.

After the aging process, the switching element was subjected to the J-V measurement. Referring to FIG. 14, in the first step of the measurement, a voltage applied to the switching element was swept from a reverse bias voltage (a negative voltage applied in FIG. 14) to a normal bias voltage (a positive voltage applied in FIG. 14), (from Arrow 1 to Arrow 5), and density of current flowing through the element was measured. Then, a sweeping was made from the normal bias voltage to the reverse bias voltage (or from Arrow 6 to Arrow 10), and density of current flowing through the element was measured. By plotting results of the measurements, a J-V characteristic curve shown in FIG. 14 was obtained. This characteristic curve shows that the element has a switching function (Arrow 4 and Arrow 9). This switching function was reproducible over 100 cycles. It should be noted that when the reverse bias voltage is applied, the current flows in a direction opposite to the direction in which the current flows under the normal bias voltage. In FIG. 14, all bias currents are plotted at their absolute values.

[Embodiments 2 and 3]

Switching elements were made in the same way as in Embodiment 1, except that the Cu and TCNQ deposition ratio was changed to 1:2 (for Embodiment 2) and 3:2 (for Embodiment 3). The element structures of Embodiments 2 and 3 are given in FIG. 12. These switching elements were also subjected to the same aging process and the J-V measurement as was Embodiment 1, and J-V characteristic curves showing a similar switching characteristic to that of Embodiment 1 were obtained. These switching functions were reproducible over 100 cycles.

[Reference 1]

Figure 15:
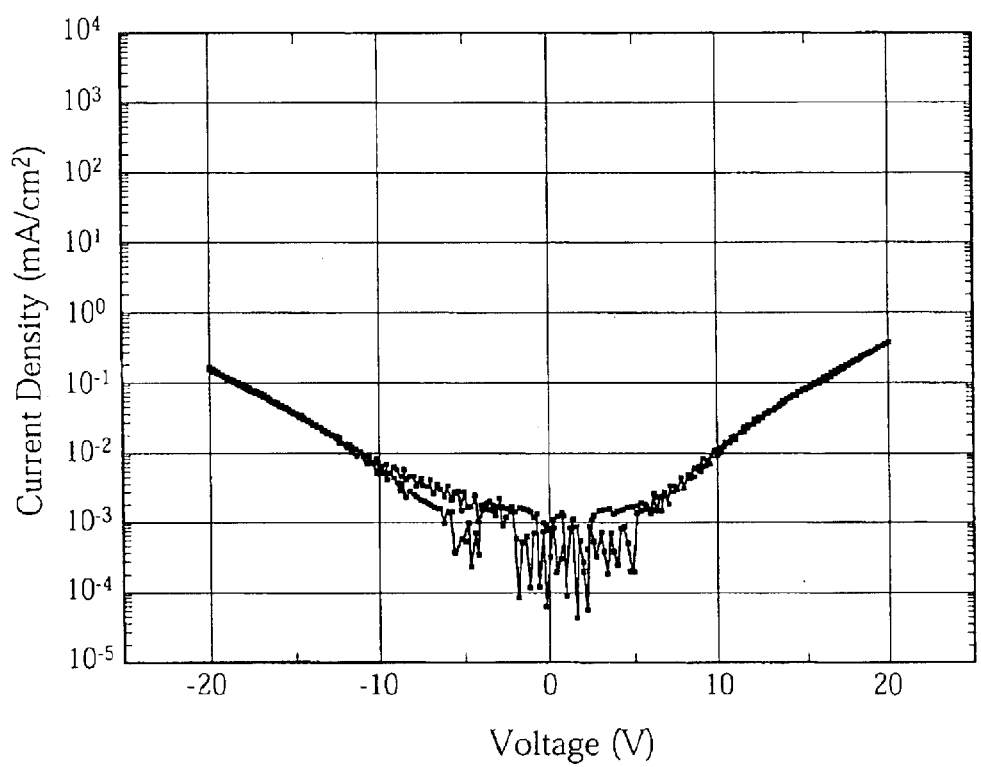
FIG. 15 shows a J-V characteristic curve in Reference 1.

A switching element was made in the same way as in Embodiment 1, except that the Cu and TCNQ deposition ratio was changed to 0:1. The element structure of this reference is given in FIG. 12. The switching element was also subjected to the same aging process and the J-V measurement as was Embodiment 1. No switching function was observed. A J-V characteristic curve obtained for this reference is shown in FIG. 15.

[References 2 and 3]

Switching elements were made in the same way as in Embodiment 1, except that the Cu and TCNQ deposition ratio was changed to 2:1 (for Reference 2) and 4:1 (for Reference 3). The element structures of these references are given in FIG. 12. The switching elements were also subjected to the same aging process and the J-V measurement as was Embodiment 1. No switching function was observed.

[Embodiments 4 through 6]

Switching elements were made in the same way as in Embodiment 1, except that the thickness of the switching layer (Cu-TCNQ thin film) was changed to 50 nm (for Embodiment 4), 200 nm (for Embodiment 5), and 300 nm (for Embodiment 6). The element structures of Embodiments 4 through 6 are given in FIG. 12. These switching elements were also subjected to the same aging process and the J-V measurement as was Embodiment 1, and J-V characteristic curves showing a similar switching characteristic to that of Embodiment 1 were obtained. These switching functions were reproducible over 100 cycles.

[Embodiments 7 through 8]

Figure 16:
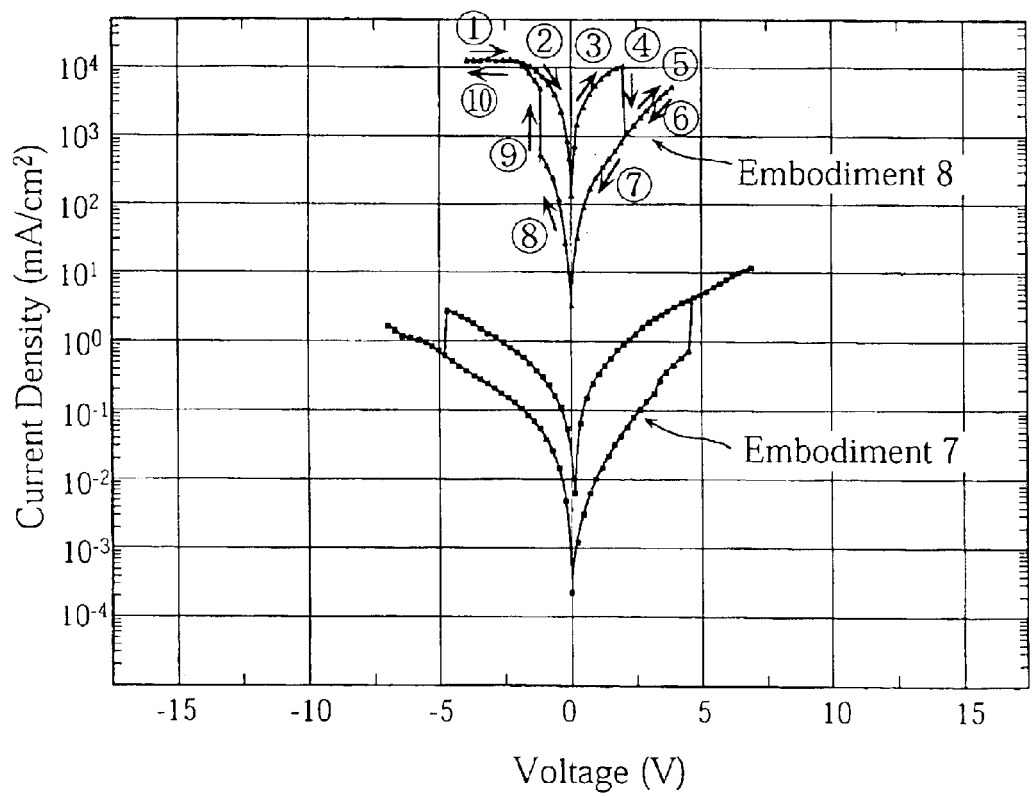
FIG. 16 shows J-V characteristic curves in Embodiment 7 and Embodiment 8.

Switching elements were made in the same way as in Embodiment 1, except that the second electrode layer was provided by a Ag layer having a thickness of 100 nm (in Embodiment 7), and by a complex layer which included a MgAg (10:1) co-deposition layer having a thickness of 100 nm and a Ag layer formed thereon to a thickness of 10 nm (in Embodiment 8). The element structures of Embodiments 7 through 8 are given in FIG. 12. These switching elements were also subjected to the same aging process and the J-V measurement as was Embodiment 1, and switching characteristics were observed. A J-V characteristic curve obtained for each switching element is shown in FIG. 16.

[Embodiment 9]

A glass substrate (10×10 mm; manufactured by Matsunami Glass Ind., Ltd,) on which an ITO layer (300 nm thickness) was formed in advance, was prepared. On the ITO layer of this substrate, a $Al_2O_3$ layer was formed to a thickness of 5 nm by means of spattering with a spattering apparatus (VULH100, manufactured by ULVAC Technologies, Inc.) The level of vacuum in the chamber was $1.0\times10^{-5}$ Torr, the depositing rate was 0.7 Å/sec and the film formation was made in Ar gas atmosphere.

Next, the substrate formed with the $ITO/Al_2O_3$ was mounted to a copper substrate specifically made for a vapor depositing apparatus (Vapor Depositing Apparatus E100 for Organic EL Research and Development; manufactured by Advanced Lab Systems Co., Ltd), and then set to a substrate holder in the chamber of the apparatus. Electrodes in the chamber were connected to a tungsten boat loaded with two 5 mm Cu wires (manufactured by Nilaco Corporation) and to a stainless steel boat loaded with approximately 1 gram of TCNQ (manufactured by Tokyo Kasei Kogyo Co., Ltd). Thereafter, the same procedure as in Embodiment 1 was used for formation of a Cu-TCNQ layer having a thickness of 100 nm, until the substrate was taken out of the chamber. After the formation of the Cu-TCNQ layer, the same procedure as in Embodiment 1 was followed for forming an Al layer having a 100 nm, until the substrate was taken out of the chamber. In this way, a switching element was made which included a glass substrate formed with a laminate structure of ITO (300 nm)/ $Al_2O_3$ (5 nm)/Cu-TCQ(100 nm)/Al (100 nm). According to the present embodiment, the ITO layer (300 nm) represents the first electrode layer, the $Al_2O_3$ (5 nm) represents the insulating layer, the Cu-TCNQ layer (100 nm) represents the switching layer, and the Al layer (100 nm) represents the second electrode layer. The element structure of the present embodiment is shown in FIG. 12.

Figure 17:
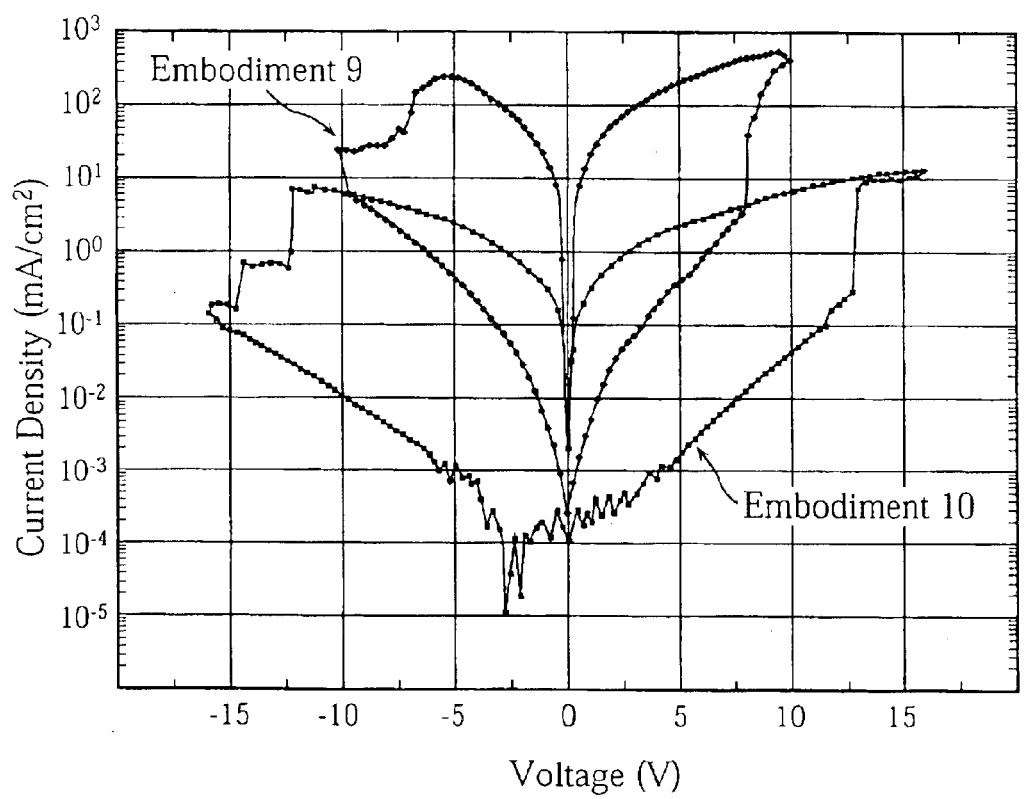
FIG. 17 shows J-V characteristic curves in Embodiment 9 and Embodiment 10.

The switching element was also subjected to the same aging process and the J-V measurement as was Embodiment 1, and a switching characteristic was observed. A J-V characteristic curve obtained in this measurement is shown in FIG. 17. This switching function was reproducible over 100 cycles.

[Embodiment 10]

A Switching element was made in the same way as in Embodiment 9, except that the thickness of the $Al_2O_3$ layer formed by means of spattering was changed to 7.5 nm. The element structure of this embodiment is given in FIG. 12. The switching element was also subjected to the same aging process and the J-V measurement as was Embodiment 1, and a switching characteristic was observed. A J-V characteristic curve obtained in this measurement is shown in FIG. 17. The switching function was reproducible over 100 cycles.

[Embodiments 11 and 12]

Figure 18:
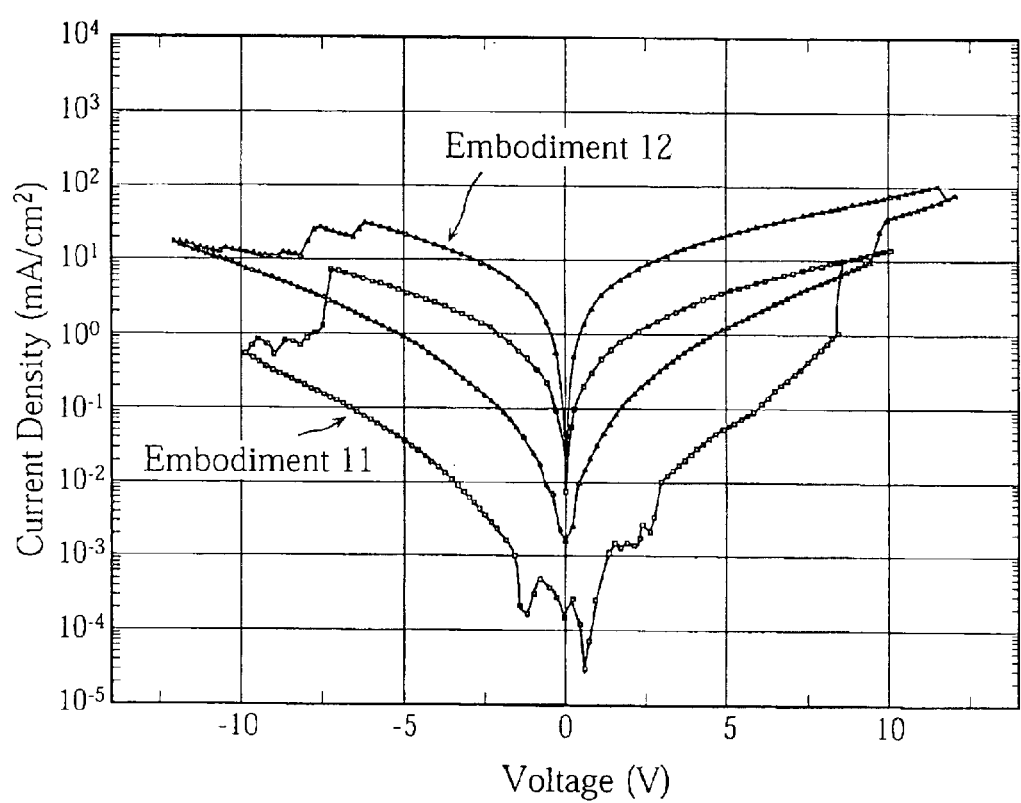
FIG. 18 shows J-V characteristic curves in Embodiment 11 and Embodiment 12.

Switching elements were made in the same way as in Embodiment 9, except that the 5-nm thick $Al_2O_3$ layer was replaced with a $SiO_2$ layer having a thickness of 5 nm (in Embodiment 11) or with a $SiO_2$ layer having a thickness of 10 nm (in Embodiment 12). The element structures of these embodiments are given in FIG. 12. The switching elements were also subjected to the same aging process and the J-V measurement as was Embodiment 1, and switching characteristics were observed. J-V characteristic curves obtained in these measurements are shown in FIG. 18.

[Reference 4]

A switching element was made in the same way as in Embodiment 9, except that the $Al_2O_3$ insulating layer was not formed. The element structure of the embodiment is given in FIG. 12. The switching element was also subjected to the same aging process and the J-V measurement as was Embodiment 1, and no switching characteristic was observed.

[Reference 5]

A glass substrate (10×10 mm; manufactured by Matsunami Glass Ind., Ltd,) on which an ITO layer (300 nm thickness) was formed in advance, was set on a substrate holder in a chamber of a spattering apparatus (VULH100, manufactured by ULVAC Technologies, Inc.) The level of vacuum in the chamber was then reduced, and after the level of vacuum has reached $1.0 \times 10^{-5}$ Torr, Ar gas was sent into the chamber at a rate of 15 ml/min, which altered the vacuum level to $7.0 \times 10^{-3}$ Torr. After the vacuum level stabilized at $7.0 \times 10^{-3}$ Torr, formation of a Cu film was made at a depositing rate of 11 Å/sec for 4 minutes and 30 seconds. The thickness of the Cu film was 300 nm. After the formation, the substrate was left under the vacuum for 10 minutes before the chamber inside pressure was returned to the normal atmosphere and the substrate was taken out. Acetone and acetonitrile were mixed at a ratio of 1:1 and this solvent was saturated with TCNQ, to make a Cu-TCNQ precipitation solution. The substrate formed with the Cu layer (300 nm) as described above was soaked into this solution for 30 minutes. Then, Cu-TCNQ complex deposited onto the Cu layer. It was not possible to control the thickness of the Cu-TCNQ film. Next, a sublimation purifier was used to dry this Cu-TCNQ film under vacuum at a room temperature for 6 hours.

Figure 19:
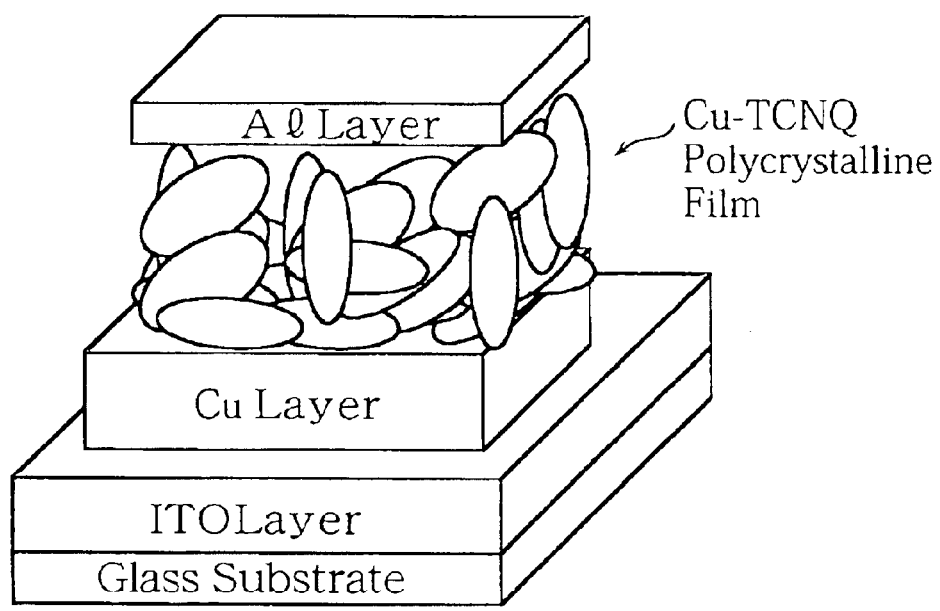
FIG. 19 is a conceptual diagram of Reference 5.

Next, the substrate dried as the above was mounted to a copper substrate specifically made for a vapor depositing apparatus (Vapor Depositing Apparatus E100 for Organic EL Research and Development; manufactured by Advanced Lab Systems Co., Ltd), and then set to a substrate holder in the chamber of the apparatus. A tungsten spiral boat loaded with approximately 1 gram of Al (manufactured by Nilaco Corporation) was connected to an electrode in the chamber. Next, pressure in the chamber was reduced, and after the level of vacuum in the chamber reached $4 \times 10^{-3}$ Pa, Al was vaporized and deposited onto the substrate at a rate of 0.5 through 1.5 Å/sec. The deposit was allowed to grow to a thickness of 30 nm. After the deposition, the substrate was left under the vacuum for 10 minutes before the chamber inside pressure was returned to the normal atmosphere and the substrate was taken out. In this way, a switching element was made which included a glass substrate formed with a laminate structure of ITO (300 nm)/Cu (300 nm)/Cu-TCQ/ Al (30 nm). The element structure according to this reference is given in FIG. 12. A conceptual drawing of the element structure is shown in FIG. 19.

<J-V Measurement>

The switching element according to the present reference was also subjected to generally the same aging process and the J-V measurement as for Embodiment 1. A switching phenomenon was observed at approximately ±2 V, and a hysteresis wave form representing a switching function was observed one time. Thereafter however, no more switching phenomenon was observed responding to any voltage sweep of the applied voltage.

<Film Structure Analysis>

UV/VIS measurement and SEM observation were performed to Cu-TCNQ films formed in the solution spreading method, or the method used for making the present reference. For the UV/VIS measurement, magnetron spattering was performed for formation of a Cu film to a thickness of 300 nm on a quartz substrate. The substrate was then soaked in the above-described Cu-TCNQ precipitation solution for approximately 1 hour, to obtain a sample having the Cu film formed with the Cu-TCNQ film. This sample was subjected to the ultraviolet-visible range absorption spectrum measurement. Absorption based on charge transfer from Cu to the TCNQ was observed at a 600–1200 nm range.

For the SEM observation, five samples were prepared: Each included a glass substrate formed with a Cu film to a thickness of 300 nm. The substrate was soaked into the above-described Cu-TCNQ precipitation solution for 5 minutes (for Sample 25), 10 minutes (for Sample 26), 20 minutes (for Sample 27), 25 minutes (for Sample 28) or 30 minutes (for Sample 29). Each Cu film was formed with a Cu-TCNQ film. For each sample, observation was made to the surface of the thin film, using a scanning electron microscope (S-3500, manufactured by Hitachi Ltd.) The surface observation of the thin film was performed to the order of 5 μm under the vacuum, with acceleration voltage of 25 kV. As a result, in Samples 25 and 26, 10-μm size crystal showed tendency to grow larger with increased time of soaking. These crystals had random orientation on the Cu film. In Sample 27, formation of fine crystals of an approximate size of 2 μm was observed. The crystals had their long axis's being parallel to the substrate, forming laminate aggregates. In Samples 28 and 29, the crystals had their long axis's being generally perpendicular to the substrate, on the crystal structure as observed in Sample 27. As described, it was learned that in the Cu-TCNQ film formation by means of the solution spreading method, layers of various crystal forms grew along with increasing time of soaking. However, no uniform boundary face was formed. In other words, as shown in FIG. 19, the Cu-TCNQ film in the present reference was a polycrystalline film.

[Evaluation]

The switching elements according to Embodiments 1 through 12 have a good switching characteristic. For example, in the switching element according to Embodiment 1, as shown in FIG. 14, an applied voltage of approximately ±10 V caused a drastic change in resistance. Specifically, when the switching element according to Embodiment 1 was subjected to a voltage sweep of an applied voltage from the reverse bias to the normal bias (from Arrow 1 to Arrow 5), the electric conductivity showed drastic decrease at approximately +10 V (at the first threshold voltage in the normal bias) or (Arrow 4). Thereafter, when the applied voltage was swept from the normal bias to the reversed bias, (from Arrow 6 to Arrow 10), the electric conductivity showed drastic increase at approximately −10 V (at the second threshold voltage in the reverse bias). In other words, the element according to Embodiment 1 changed its state from a high-resistance state to a low-resistance state at approximately +10 V, and returned from the high-resistance state to the low-resistance state at approximately −10 V. The element according to Embodiment 1 is capable of repeating a switching action of such a characteristic over 100 times. Further, under an applied voltage of 5 V, current density in the high-resistance state and current density in the low-resistance state differ from each other by 100 or greater. Therefore, the element according to Embodiment 1 can serve as a good switching element in a variety of electronic devices.

The switching elements according to Embodiments 2 through 7, and 9 through 12 each have a switching characteristic in the same direction as in the element according to Embodiment 1. On the contrary, the switching element according to Embodiment 8 has a switching characteristic in the reverse direction as in the element according to Embodiment 1. Specifically, as shown in FIG. 16, when the switching element according to Embodiment 8 was subjected to a voltage sweep of an applied voltage from the reverse bias to the normal bias (from Arrow 1 to Arrow 5), the electric conductivity showed drastic increase at approximately +2 V (at the first threshold voltage in the normal bias) or (Arrow 4). Thereafter, when the applied voltage was swept from the normal bias to the reversed bias, (from Arrow 6 to Arrow 10), the electric conductivity showed drastic decrease at approximately −1.5 V (at the second threshold voltage in the reverse bias). In other words, the element according to Embodiment 8 changed its state from a low-resistance state to high low-resistance state at approximately +2 V, and returned from the high-resistance state to the low-resistance state at approximately −1.5 V.

The switching elements according to Embodiment 1 and Embodiments 4 through 6 differ from each other only in the thickness of the switching layer. In all of the elements, generally the same switching characteristic was obtained. On the other hand, Reference 4 which was not formed with the insulating layer contacting the switching layer did not show a switching characteristic. From these facts, it is considered that the switching phenomenon according to the present invention is not dependent upon the film thickness, and is a boundary face phenomenon between the switching layer and the insulating layer.

Figure 20A:
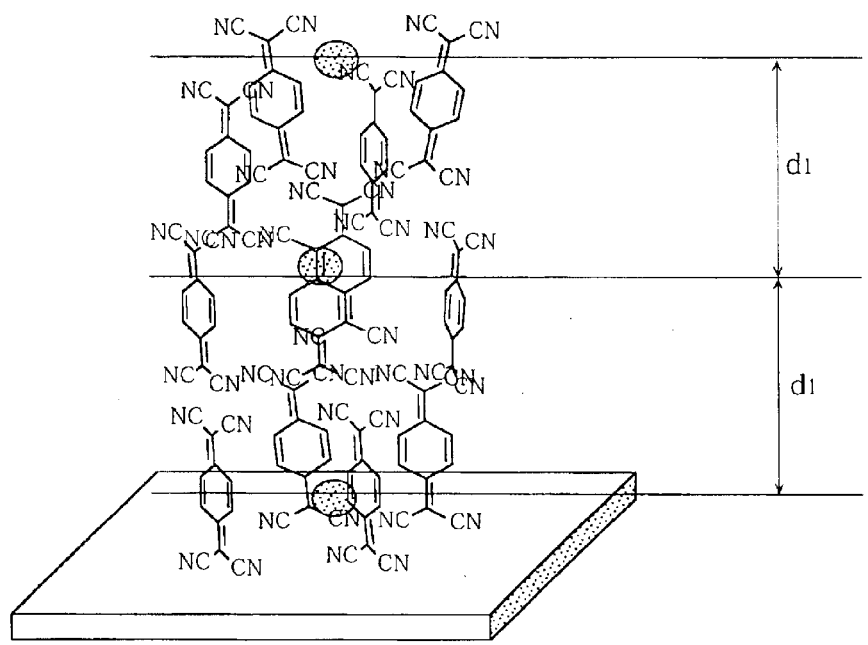
FIG. 20A and FIG. 20B are diagrams illustrating a switching mechanism in the present invention.
Figure 20B:
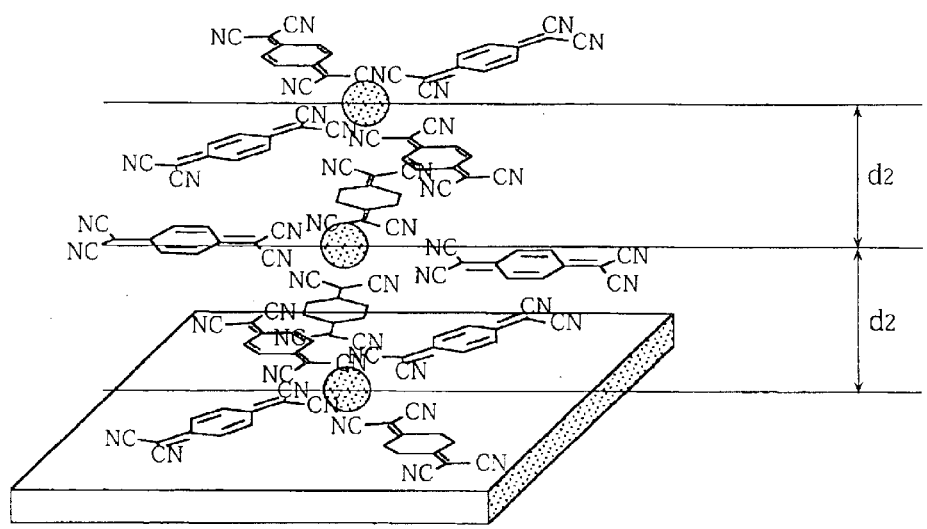

Based on the characteristics of Embodiment 1 through 12, References 1 through 5, and the film structure analysis performed to the charge transfer complex thin film samples, the inventor of the present invention et al consider the switching mechanism in the switching element provided by Cu and TCNQ to be as follows:

In the switching layer, Cu forms columns in the direction of deposition when the film was made. TCNQ surrounds the columns. As indicated by the UV/VIS angle dependency measurements, most of TCNQ serving in the switching layer in its high-resistance state is parallel to the surface of substrate. However, TCNQ near the boundary surface between the switching layer and the insulating layer is upright or perpendicular to the insulating layer or the substrate as shown in FIG. 20A, even in the high-resistance state due to an influence from the surface of insulating layer. Due to this upright orientation of the TCNQ, the interatomic distance ($d_1$) in Cu which provides the Cu columns in the upright region is stretched. In other words, the interatomic distance ($d_1$) in the Cu near the insulating layer is longer than the interatomic distance in Cu far from the insulating layer, making it accordingly difficult for electrons to pass through the Cu columns; i.e. the switching layer takes a high-resistance state. In such a state, when a voltage is applied in a predetermined bias at a voltage greater than a threshold value, the upright TCNQ near the insulating layer becomes parallel, as shown in FIG. 20B, to the surface of the insulating layer or the surface of the substrate. This shortens an interatomic distance ($d_2$) in Cu which provides the Cu columns. Specifically, the interatomic distance ($d_2$) in Cu near the insulating layer becomes equal to the interatomic distance Cu far from the insulating layer, making it accordingly easier for electrons to pass through the Cu columns; i.e. the switching layer takes a low-resistance state. The inventor et al consider that such a change in the interatomic distance in the Cu based on the TCNQ orientation change in the boundary face between the switching layer and the insulating layer provides the switching phenomenon.

The present invention has been described thus far, but it is obvious that the invention can be varied in many other ways. These variations should not be excluded from the spirit or the scope of the present invention. Any change obvious to those skilled in the art should be included in the scope of the present invention.

What is claimed is:

1. A switching element comprising:
   a first electrode layer and a second electrode layer;
   a switching layer including a charge transfer complex containing an electron donor and an electron acceptor between the first electrode layer and the second electrode layer; and
   an insulating layer contacting the switching layer between the first electrode layer and the switching layer,
   wherein the switching layer switches from a high-resistance state to a low-resistance state upon application of a voltage greater than a first threshold value in a first bias direction between the first electrode layer and the second electrode layer, maintaining the low-resistance state when the applied voltage decreases thereafter beyond the first threshold value, and switches from the low-resistance state to the high-resistance state upon application of a voltage greater than a second threshold value in a second bias direction or a reverse direction to the first bias direction, maintaining the high-resistance state when the applied voltage decreases thereafter beyond the second threshold value.

2. The switching element according to claim 1, further comprising an additional insulating layer between the switching layer and the second electrode layer.

3. The switching element according to claim 1, wherein the first bias direction is a direction of voltage drop from one of the first and the second electrode layers to the other.

4. The switching element according to claim 1, wherein the electron acceptor is provided by an organic compound having a pi electron system.

5. The switching element according to claim 4, wherein the electron acceptor is provided by TCNQ or a derivative of TCNQ.

6. The switching element according to claim 1, wherein the electron donor is provided by a metal.

7. The switching element according to claim 6, wherein the metal is selected from a group consisting of Cu, Ag and K.

8. The switching element according to claim 1, wherein a presence ratio of the electron donor to the electron acceptor in the switching layer is not smaller than a half and not greater than three seconds.

9. The switching element according to claim 1, wherein the switching layer contains an amorphous structure.

10. The switching element according to claim 1, wherein the insulating layer contains an oxide.

11. The switching element according to claim 10, wherein the oxide is provided by $Al_2O_3$ or $SiO_2$.

12. The switching element according to claim 1, wherein the second electrode layer contacts the switching layer, and contains at least one of Al, Mg and Ag.

13. A method of making a switching element which switches from a high-resistance state to a low-resistance state upon application of a voltage greater than a first threshold value in a first bias direction between the first electrode layer and the second electrode layer, maintaining the low-resistance state when the applied voltage decreases thereafter beyond the first threshold value, and switches from the low-resistance state to the high-resistance state upon application of a voltage greater than a second threshold value in a second bias direction or a reverse direction to the first bias direction, maintaining the high-resistance state when the applied voltage decreases thereafter beyond the second threshold value, the method comprising:

a first-electrode layer forming step for formation of a first electrode layer on a substrate;

an insulating layer forming step for formation of an insulating layer on the first electrode layer;

a switching layer forming step for formation of a switching layer by depositing an electron donor material and an electron acceptor material on the insulating layer; and a second-electrode layer forming step for formation of a second electrode layer.

14. The method according to claim 13, further including a step of forming an additional insulating layer on the switching layer after the switching layer forming step.

15. The method according to claim 13, wherein the first-electrode forming step uses a vacuum deposition method or a spattering method for deposition of a first electrode material on the substrate, the deposited electrode material in the first-electrode forming step being exposed to the atmosphere in the insulating layer forming step.

16. The method according to claim 13, wherein a surface of the first electrode layer formed in the first-electrode forming step is subjected to a UV ozone treatment in the insulating layer forming step.

17. The method according to claim 13, wherein the switching layer forming step uses a vacuum deposition method for deposition of the electron donor material and the electron acceptor material on the insulating layer.

18. The method according to claim 13, wherein a ratio of a deposition rate of the electron donor material to a deposition rate of the electron acceptor material in the switching layer forming step is not smaller than 1.5/0.7 and not greater than 1.9/0.3.

19. The method according to claim 13, further comprising a curing step of leaving the element under vacuum after the second-electrode layer forming step.

20. The method according to claim 13, further comprising an aging step for application of a voltage between the first electrode layer and the second electrode layer.

* * * * *